(12) United States Patent
Jeong

(10) Patent No.: US 8,022,435 B2
(45) Date of Patent: Sep. 20, 2011

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 128 days.

(21) Appl. No.: 12/618,490

(22) Filed: Nov. 13, 2009

(65) Prior Publication Data

US 2010/0123147 A1    May 20, 2010

(30) Foreign Application Priority Data

Nov. 14, 2008 (KR) .................. 10-2008-0113228

(51) Int. Cl.
*H01L 33/00* (2010.01)
(52) U.S. Cl. ....... 257/99; 257/98; 257/100; 257/E33.06; 257/E33.059; 257/E33.062
(58) Field of Classification Search .................... 257/98, 257/99, 100, E33.059, E33.062, E33.06
See application file for complete search history.

(56) References Cited

U.S. PATENT DOCUMENTS

| | | | |
|---|---|---|---|
| 7,592,633 B2 * | 9/2009 | Shakuda | 257/88 |
| 7,763,898 B2 * | 7/2010 | Tanaka et al. | 257/87 |
| 2004/0245540 A1 | 12/2004 | Hata et al. | |
| 2005/0017252 A1 | 1/2005 | Streubel et al. | |
| 2005/0184297 A1 | 8/2005 | Hsieh | |
| 2007/0069222 A1 | 3/2007 | Koi et al. | |
| 2007/0114511 A1 | 5/2007 | Kim et al. | |
| 2007/0200493 A1 | 8/2007 | Hsu et al. | |
| 2007/0221944 A1 * | 9/2007 | Cheol Yoo | 257/99 |
| 2008/0217638 A1 | 9/2008 | Choi | |

FOREIGN PATENT DOCUMENTS

| | | |
|---|---|---|
| JP | 2007-251221 A | 9/2007 |
| KR | 10-0452749 B1 | 10/2004 |
| KR | 10-2005-0037324 A | 4/2005 |
| KR | 10-2008-0076344 A | 8/2008 |
| WO | WO 2007/013757 A1 | 2/2007 |

* cited by examiner

*Primary Examiner* — Victor A Mandala

(74) *Attorney, Agent, or Firm* — Birch, Stewart, Kolasch & Birch, LLP

(57) ABSTRACT

Disclosed is a semiconductor light emitting device. The semiconductor light emitting device includes a light emitting structure including a plurality of compound semiconductor layers including a first conductive semiconductor layer, an active layer and a second conductive semiconductor layer; an electrode layer on the plurality of compound semiconductor layers; and a channel layer including protrusion and formed along a peripheral portion of an upper surface of the plurality of compound semiconductor layers.

14 Claims, 6 Drawing Sheets

SEMICONDUCTOR LIGHT EMITTING DEVICE

CROSS-REFERENCE TO RELATED APPLICATIONS

The present application claims priority under 35 U.S.C. 119 to Korean Patent Application No. 10-2008-0113228 (filed on Nov. 14, 2008), which is hereby incorporated by reference in its entirety.

BACKGROUND

The embodiment relates to a semiconductor light emitting device.

Groups III-V nitride semiconductors have been variously applied to an optical device such as blue and green light emitting diodes (LED), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED or an LD (laser diode), and studies have been continuously conducted to improve the manufacturing process or light efficiency of the nitride semiconductor.

SUMMARY

The embodiment provides a semiconductor light emitting device capable of enhancing adhesive force between a semiconductor layer and another layer.

The embodiment provides a semiconductor light emitting device, which can enhance adhesive force between a second conductive semiconductor layer and a channel layer on the second conductive semiconductor layer by forming a roughness pattern on an outer surface of the second conductive semiconductor layer.

An embodiment provides a semiconductor light emitting device comprising: a plurality of compound semiconductor layers including a first conductive semiconductor layer, an active layer and a second conductive semiconductor layer; an electrode layer on the plurality of compound semiconductor layers; and a channel layer including protrusion and formed along a peripheral portion of an upper surface of the plurality of compound semiconductor layers.

An embodiment provides a semiconductor light emitting device comprising: a plurality of compound semiconductor layers including a first conductive semiconductor layer, an active layer on the first conductive semiconductor layer and a second conductive semiconductor layer on the active layer; an electrode electrically connected to the first conductive semiconductor layer; an electrode layer on the plurality of compound semiconductor layers; a conductive support member on the electrode layer; a channel layer formed along a peripheral portion of an upper surface of the second conductive semiconductor layer: and a protrusion protruding downward from the channel layer.

The details of one or more embodiments are set forth in the accompanying drawings and the description below. Other features will be apparent from the description and drawings, and from the claims.

DETAILED DESCRIPTION OF THE EMBODIMENTS

Figure 1:
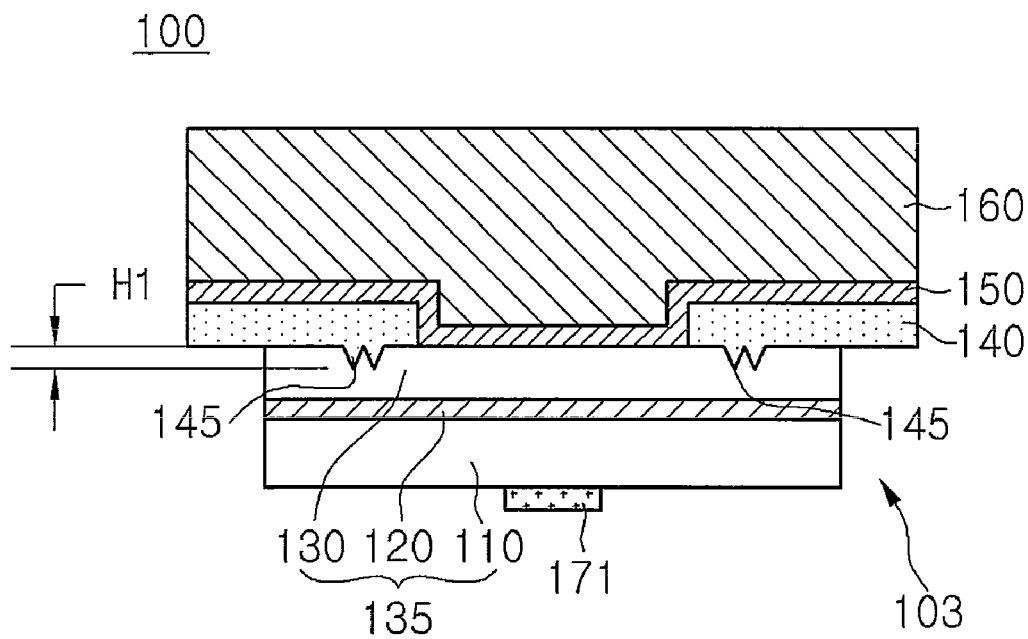
FIG. 1 is a side sectional view showing a semiconductor light emitting device according to a first embodiment.

Hereinafter, a semiconductor light emitting device according to an embodiment will be described with reference to the accompanying drawings. In the description of the embodiment, the term "on" or "under" of each layer will be described with reference to the accompanying drawings and thickness of each layer is not limited to thickness shown in the drawings.

In the description of an embodiment, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern.

Figure 2:
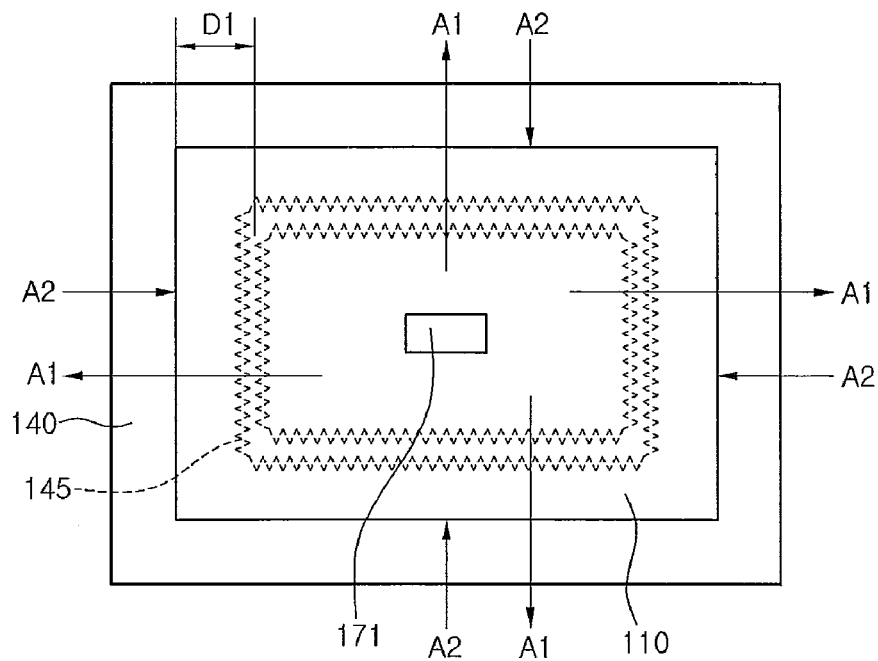
FIG. 2 is a bottom view showing the semiconductor light emitting device shown in FIG. 1.

FIG. 1 is a side sectional view showing a semiconductor light emitting device according to a first embodiment and FIG. 2 is a bottom view showing the semiconductor light emitting device shown in FIG. 1.

Referring to FIGS. 1 and 2, the semiconductor light emitting device 100 includes a light emitting structure 135, a channel layer 140 having a protrusions 145, an electrode layer 150 and a conductive support member 160.

The semiconductor light emitting device 100 includes a compound semiconductor, e.g., an LED based on III-V group compound semiconductors, and the LED may include a color LED emitting blue light, green light or red light or an UV LED. The light emitted from the LED may be variously realized within the technical scope of the embodiment.

The light emitting structure 135 includes a first conductive semiconductor layer 110, an active layer 120 and a second conductive semiconductor layer 130.

The first conductive semiconductor layer 110 may include one selected from the group consisting of GaN, AlN, AlGaN, InGaN, InN, InAlGaN, AlInN, AlGaAs, GaP, GaAs, GaAsP and AlGaInP, which are compound semiconductors of III-V group elements doped with a first conductive dopant. When the first conductive semiconductor layer 110 is an N type semiconductor layer, the first conductive dopant includes an N type dopant such as Si, Ge, Sn, Se or Te. The first conductive semiconductor layer 110 may have a single layer or a multilayer. However, the embodiment is not limited thereto.

An electrode 171 having a predetermined shape or a predetermined pattern is formed under the first conductive semiconductor layer 110, and may have a predetermined shape or may be formed in a predetermined pattern. However, the embodiment is not limited thereto. The first conductive semiconductor layer 110 may be provided on a lower surface thereof with a roughness pattern.

The active layer 120 is formed on the first conductive semiconductor layer 110 and may have a single quantum well structure or a multi-quantum well structure. The active layer 120 may have an arrangement of a well layer and a barrier layer using compound semiconductor materials of the III-V group elements. For example, the active layer 120 may have an arrangement of an InGaN well layer and a GaN barrier layer. A conductive clad layer may be formed on and/or under the active layer 120, and include an AlGaN-based layer.

The second conductive semiconductor layer 130 is formed on the active layer 120, and may include one selected from the group consisting of GaN, AlN, AlGaN, InGaN, InN, InAlGaN, AlInN, AlGaAs, GaP, GaAs, GaAsP and AlGaInP, which are the compound semiconductors of III-V group elements doped with a second conductive dopant. When the second conductive semiconductor layer 120 is a P type semiconductor layer, the second conductive dopant includes a P type dopant such as Mg and Zn. The second conductive semiconductor layer 120 may have a single layer or a multi-layer. However, the embodiment is not limited thereto.

The light emitting structure 135 may include an N type semiconductor layer or a p type semiconductor layer on the second conductive semiconductor layer 120. Further, the first conductive semiconductor layer 110 may be provided as a p type semiconductor layer and the second conductive semiconductor layer 130 may be provided as an N type semiconductor layer. The light emitting structure 135 may include at least one of an N-P junction structure, a P-N junction structure, an N-P-N junction structure and a P-N-P junction structure.

The channel layer 140 and the electrode layer 150 are formed on the second conductive semiconductor layer 130. The channel layer 140 is formed along the peripheral portion of an upper surface of the light emitting structure 135, and the electrode layer 150 is formed at the inner side of the upper surface of the light emitting structure 135.

The channel layer 140 may have a band shape, a ring shape or a frame shape and can be formed along the peripheral surface of the second conductive semiconductor layer 130 in the form of a circle or a polygon.

An inner side of the channel layer 140 makes contact with an outer side of an upper surface of the second conductive semiconductor layer 130, and an outer side of the channel layer 140 extends to the extent that the outer side of the channel layer 140 is exposed to the peripheral surface 103 of the light emitting structure 135. Thus, the channel layer 140 is arranged such that an outer wall of the light emitting structure 135 can be spaced apart from the electrode layer 150 or the conductive support member 160.

The channel layer 140 may include transmittive insulating material or transmittive conductive material. For example, the channel layer 140 may include at least one selected from the group consisting of $SiO_2$, $SiO_x$, $SiO_xN_y$, $Si_3N_4$, $Al_2O_3$, $TiO_2$, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO.

The channel layer 140 may include material, which allows laser to pass therethrough, or material which generates no fragments when laser passes therethrough. Further, the channel layer 140 may include transmittive material which can be bonded to the material of the second conductive semiconductor layer 130.

The protrusions 145 are formed at the under surface of the inner side of the channel layer 140. The protrusion 145 protrude toward the light emitting structure 135, that is, the protrusion 145 protrude downward, so adhesive force of the channel layer 140 can be enhanced.

The protrusion 145 of the channel layer 140 may be formed on the second conductive semiconductor layer 130 in the form of a band with a concave-convex section. The protrusion 145 can be provided in a continuous pattern such as a closed loop, or a discontinuous pattern along the peripheral portion of the upper portion of the second conductive semiconductor layer 130. Further, the protrusion 145 formed on the second conductive semiconductor layer 130 may have a single configuration, a double configuration or a multiple configuration, and may have a zigzag shape pattern, an irregular shape pattern and the like.

The protrusion 145 of the channel layer 140 may have a polygonal sectional shape, such as a triangle, a rectangle, a lozenge or a trapezoid, a horn sectional shape, a semispherical sectional shape, and a semi-oval sectional shape. The shape of the protrusion 145 can be modified within the technical scope of the embodiment.

The protrusion 145 may have a height H1 (i.e. protrusion length) of about 10 nm to about 300 nm. The dual protrusion 145 may have the same height or heights different from each other. For example, the height of the dual protrusion 145 may be reduced or increased toward an outer portion of the second conductive semiconductor layer 130.

The protrusion 145 of the channel layer 140 may be spaced apart from the outer wall of the light emitting structure 135 by a predetermined distance D1, e.g., about 1. to about 5., and the distance D1 may vary according to the size of the light emitting structure 135.

A contact area between the channel layer 140 and the second conductive semiconductor layer 130 is increased due to the protrusions 145. The protrusion 145 can prevent the second conductive semiconductor layer 130 from moving in an outward direction A1 of the second conductive semiconductor layer 130.

Further, the protrusion 145 of the channel layer 140 can delay or prevent penetration of moisture in an inward direction A2 of the second conductive semiconductor layer 130.

The electrode layer 150 is formed on the second conductive semiconductor layer 130. The electrode layer 150 may be formed on the channel layer 140.

A layer or a plurality of patterns is formed between the second conductive semiconductor layer 130 and the electrode layer 150, so current distribution caused by resistance difference can be dispersed. The layer or the plurality of patterns includes at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, and RuOx.

The electrode layer 150 is formed on the second conductive semiconductor layer 130. The electrode layer 150 may comprises at least one of a reflective electrode layer, an ohmic-contact layer, and an adhesion layer. The electrode layer 150 may include at least one of metallic material and oxide material. The reflective electrode layer may includes at least one of Ag, Ni, Al, Rh, Pd, Ir, Ru, Mg, Zn, Pt, Au, Hf, or the selective combination of the above. The ohmic-contact layer may include at least one at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO, Pt, Ni, Au, Rh and Pd. The adhesion layer may include at least one of Ti, Au, Sn, Ni, Cr, Ga, In, Bi, Cu, Ag, and Ta. The electrode layer 150 may comprises a seed metal.

The electrode layer 150 can be prepared in the form of a layer or a plurality of patterns. However, the embodiment is not limited thereto.

An ohmic contact layer (not shown) may be formed between the electrode layer 150 and the second conductive semiconductor layer 130. The ohmic contact layer may include at least one selected from the group consisting of ITO, IZO, IZTO, IAZO, IGZO, IGTO, AZO, ATO, GZO, IrOx, RuOx, RuOx/ITO, Ni/IrOx/Au and Ni/IrOx/Au/ITO.

The conductive support member 160 is formed on the electrode layer 150. The conductive support member 160 may function as a base substrate and is used to supply power. The conductive support member 160 can be prepared in the form of a layer or a plurality of patterns.

The conductive support member 160 may include Cu, Au, Ni, Mo, Cu—W, and carrier wafer such as Si, Ge, GaAs, ZnO, SiC, SiGe, ad GaN. The conductive support member 160 may be formed through an electrolytic plating scheme or can be prepared in the form of a sheet.

The electrode layer 150 and the conductive support member 160 can be prepared in the form of a single electrode layer having a predetermined thickness.

FIGS. 3 to 12 are views showing the procedure of manufacturing the semiconductor light emitting device shown in FIG. 1.

Figure 3:
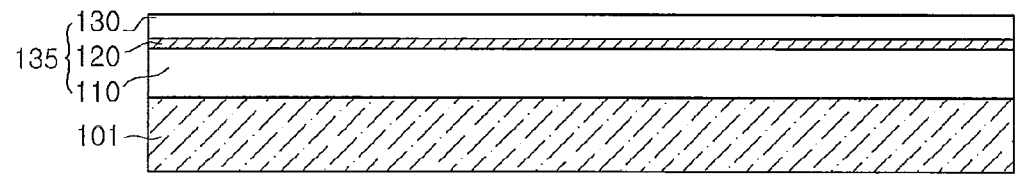
FIGS. 3 to 12 are views showing the procedure of manufacturing the semiconductor light emitting device shown in FIG. 1.

Referring to FIG. 3, a substrate 101 is loaded on growing equipment and a compound semiconductor layer of □ to □ group elements is formed on the substrate 101.

The growing equipment may include E-beam deposition equipment, physical vapor deposition (PVD) equipment, chemical vapor deposition (CVD) equipment, plasma laser deposition (PLD) equipment, a dual-type thermal evaporator, sputtering equipment and metal organic chemical vapor deposition (MOCVD) equipment. However, the embodiment is not limited thereto.

The substrate 101 may include one selected from the group consisting of sapphire ($Al_2O_3$), GaN, SiC, ZnO, Si, GaP, InP, $GA_2O_3$, a conductive substrate and GaAs. The substrate 101 is provided thereon with a concave-convex pattern. Further, a layer or a pattern using compound semiconductors of II to VI group elements may be formed on the substrate 101. For example, at least one of a ZnO layer (not shown), a buffer layer (not shown) and an undoped semiconductor layer (not shown) may be formed on the substrate 101.

The buffer layer and the undoped semiconductor layer may include the compound semiconductors of the III-V group elements. The buffer layer reduces a lattice constant difference from the substrate 101, and the undoped semiconductor layer may include an undoped GaN-based semiconductor layer.

The light emitting structure 135 including the compound semiconductor layers is formed on the substrate 101. The first conductive semiconductor layer 110 is formed on the substrate 101, the active layer 120 is formed on the first conductive semiconductor layer 110, and the second conductive semiconductor layer 130 is formed on the active layer 120.

The first conductive semiconductor layer 110 may include one selected from the group consisting of GaN, AlN, AlGaN, InGaN, InN, InAlGaN, AlInN, AlGaAs, GaP, GaAs, GaAsP and AlGaInP, which are compound semiconductors of III-V group elements doped with the first conductive dopant. When the first conductive semiconductor layer 110 is the N type semiconductor layer, the first conductive dopant includes the N type dopant such as Si, Ge, Sn, Se or Te. The first conductive semiconductor layer 110 may have the single layer or the multilayer. However, the embodiment is not limited thereto.

The active layer 120 is formed on the first conductive semiconductor layer 110 and may have the single quantum well structure or the multi-quantum well structure. The active layer 120 may have an arrangement of the well layer and the barrier layer using the compound semiconductor materials of the III-V group elements. For example, the active layer 120 may have an arrangement of the InGaN well layer and the GaN barrier layer.

The conductive clad layer may be formed on and/or under the active layer 120, and may include the AlGaN-based layer.

The second conductive semiconductor layer 130 is formed on the active layer 120, and may include one selected from the group consisting of GaN, AlN, AlGaN, InGaN, InN, InAlGaN, AlInN, AlGaAs, GaP, GaAs, GaAsP and AlGaInP, which are the compound semiconductors of the III-V group elements doped with the second conductive dopant. When the second conductive semiconductor layer 120 is the P type semiconductor layer, the second conductive dopant includes the P type dopant such as Mg and Zn. The second conductive semiconductor layer 120 may have the single layer or the multilayer. However, the embodiment is not limited thereto.

The first conductive semiconductor layer 110, the active layer 120, and the second conductive semiconductor layer 130 can be defined as the light emitting structure 135. A third conductive semiconductor layer (not shown), e.g., an N type semiconductor layer or a p type semiconductor layer, can be formed on the second conductive semiconductor layer 130. The light emitting structure 135 may include at least one of the N-P junction structure, the P-N junction structure, the N-P-N junction structure and the P-N-P junction structure.

Figure 4:
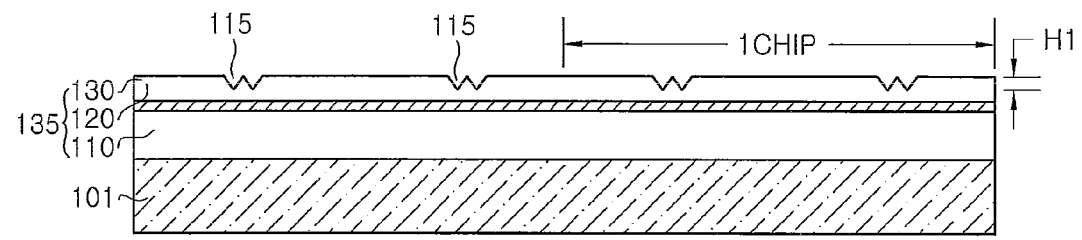

Referring to FIG. 4, grooves 115 are formed along the peripheral portion of the upper surface of the second conductive semiconductor layer 130 in an individual chip area. The grooves 115 may have a roughness structure, such as a concave-convex structure. The grooves 115 may have a single configuration, a double configuration or a multiple configuration.

The grooves 115 have positions and shapes corresponding to those of the protrusions 145 of the channel layer 140.

The grooves 115 are formed by forming a mask pattern relative to the second conductive semiconductor layer 130, and etching the mask pattern using a predetermined etching scheme, e.g., a dry etching scheme. However, the embodiment is not limited to thereto.

Figure 5:
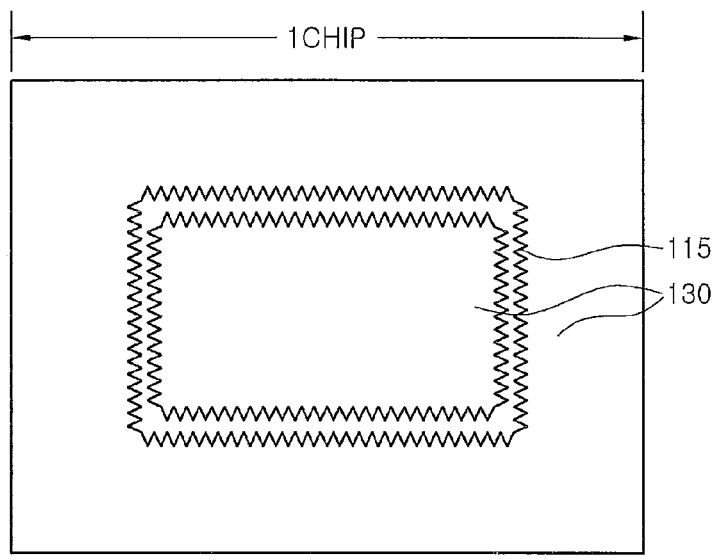

FIG. 5 is a plan view showing a first pattern of the groove shown in FIG. 4.

Referring to FIGS. 4 and 5, the grooves 115 are formed along the outer peripheral portion of a single chip in the form of a double band shape and can be provided in the form of a continuous pattern such as a closed loop. The dual grooves 115 may be regularly or irregularly spaced apart from each other by taking adhesive force into consideration.

The grooves 115 may have a zigzag shape or an irregular shape along the outer peripheral portion of the second conductive semiconductor layer 130. Further, the grooves 115 may have a polygonal sectional shape, such as a triangle, a rectangle, a lozenge or a trapezoid, a horn sectional shape, a semispherical sectional-shape, and a semi-oval sectional shape. The shape of the grooves 115 can be modified within the technical scope of the embodiment. Further, the grooves 115 may be arranged in one row, two rows or more on the basis of an outer surface of the chip and may have the same depth or not.

Each groove 115 may have a depth H1 of about 100 nm to about 300 nm from the upper surface of the second conductive semiconductor layer 130.

Figure 6:
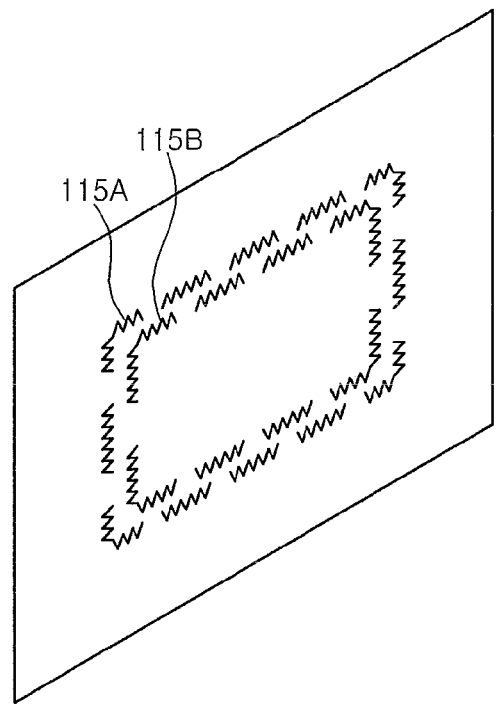
Figure 7:
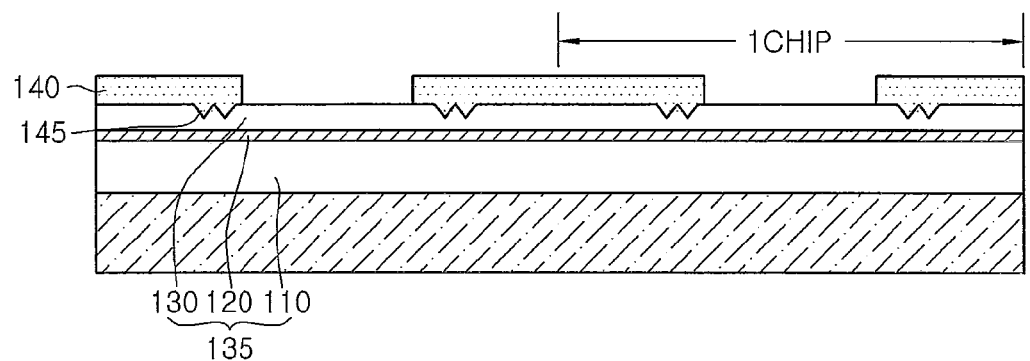

FIG. 6 is a plan view showing a second pattern of the groove shown in FIG. 4.

Referring to FIG. 6, the grooves 115A and 115B may have a dual band structure and can be prepared in the form of a discontinuous pattern. Further, the dual grooves 115A and 115B may offset from each other to enhance adhesive strength.

Referring to FIGS. 4 and 6, the channel layer 140 is formed along the outer peripheral portion of the second conductive semiconductor layer 130.

The channel layer 140 is formed along the peripheral surface of the upper surface of the second conductive semiconductor layer 130 in the form of a ring shape or a frame shape in a boundary area of an individual chip. The channel layer 140 can be prepared in the form of a continuous pattern.

The channel layer 140 may include the insulating material or the conductive material. For example, the channel layer 140 may include at least one selected from the group consisting of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, RuOx, RuOx/ITO, Ni/IrOx/Au and Ni/IrOx/Au/ITO.

Further, the channel layer 140 may further include material, which allows laser to pass therethrough, or material which generates no fragments when laser passes therethrough. Further, the channel layer 140 may include transmittive material capable of enhancing adhesive force between the second conductive semiconductor layer 130 and the channel layer 140.

The protrusions 145 of the channel layer 140 are aligned corresponding to the grooves 115 of the second conductive semiconductor layer 130. Since the protrusions 145 have shape and position corresponding to those of the grooves 115, detailed description thereof will be omitted.

The protrusions 145 of the channel layer 140 may be spaced apart from the outer wall of the light emitting structure 135 by a predetermined distance, e.g., about 1. to about 5., and the distance may vary depending on the size of the light emitting structure 135.

The contact area between the channel layer 140 and the second conductive semiconductor layer 130 is increased due to the protrusions 145. The protrusion 145 enhances adhesive force in the outward direction (see A1 in FIG. 2) of the second conductive semiconductor layer 130 to prevent movement of the second conductive semiconductor layer 130 and the channel layer 140.

Figure 8:
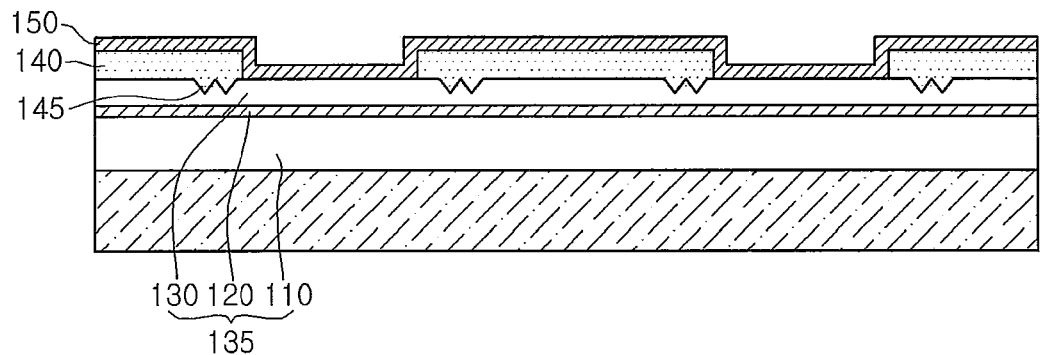
Figure 9:
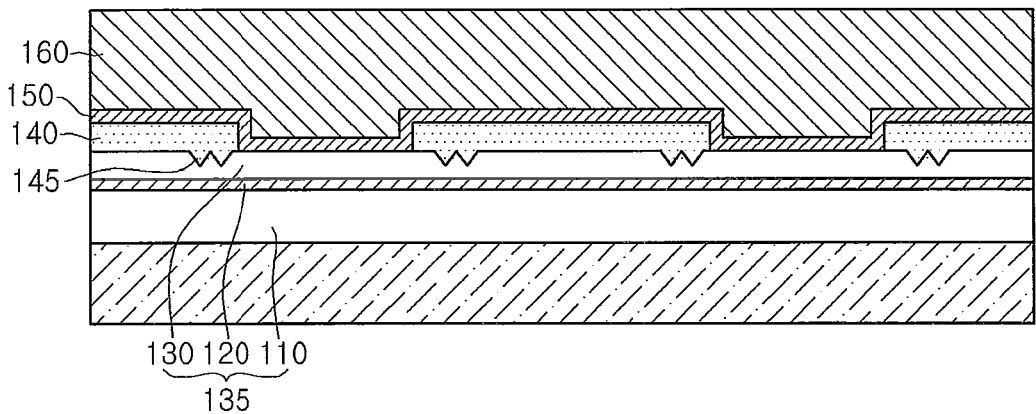

Further, the protrusion 145 of the channel layer 140 can delay or prevent penetration of moisture in the inward direction (see A2 in FIG. 2) of the second conductive semiconductor layer 130. Referring to FIGS. 8 and 9, the electrode layer 150 is formed on the second conductive semiconductor layer 130 or the third conductive semiconductor layer. The electrode layer 150 may be formed on the channel layer 140. The conductive support member 160 is formed on the electrode layer 150. The electrode layer 150 may be formed on a portion or the entire portion of the second conductive semiconductor layer 130 by using a sputtering apparatus. The electrode layer 150 may be formed by using at least one material including seed material, ohmic material, reflective material and adhesion material.

The electrode layer 150 may comprise at least one of a reflective electrode layer, an ohmic-contact layer, and an adhesion layer. The electrode layer 150 may include at least one of metallic material and oxide material. The reflective electrode layer may includes at least one of Ag, Ni, Al, Rh, Pd, Ir, Ru, Mg, Zn, Pt, Au, Hf, or the selective combination of the above. The ohmic-contact layer may include at least one at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO, Pt, Ni, Au, Rh and Pd. The adhesion layer may include at least one of Ti, Au, Sn, Ni, Cr, Ga, In, Bi, Cu, Ag, and Ta. The electrode layer 150 may comprises a seed metal.

A layer or a plurality of patterns may be further formed between the second conductive semiconductor layer 130 and the electrode layer 150, so current distribution caused by resistance difference can be dispersed. The layer or the plurality of patterns includes at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, and RuOx.

An ohmic-contact layer (not shown) may be further formed between the electrode layer 150 and the second conductive semiconductor layer 130. The ohmic-contact layer may include a layer or a plurality of patterns. The ohmic-contact layer includes at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au and Ni/IrOx/Au/ITO, but the embodiment is not limited thereto.

The conductive support member 160 is formed on the electrode layer 150. The conductive support member 160 may function as the base substrate. The conductive support member 160 may include Cu, Au, Ni, Mo, Cu—W, and carrier wafer such as Si, Ge, GaAs, ZnO, SiC, SiGe and GaN. The conductive support member 160 may be formed through the electrolytic plating scheme or can be prepared in the form of the sheet. However, the embodiment is not limited thereto.

The electrode layer 150 and the conductive support member 160 can be prepared in the form of a layer or a pattern. The conductive support member 160 may have a thickness of about 30. to about 150. However, the embodiment is not limited thereto. The electrode layer 150 and the conductive support member 160 can be prepared in the form of a single electrode layer, e.g., the electrode layer. However, the embodiment is not limited thereto.

Figure 10:
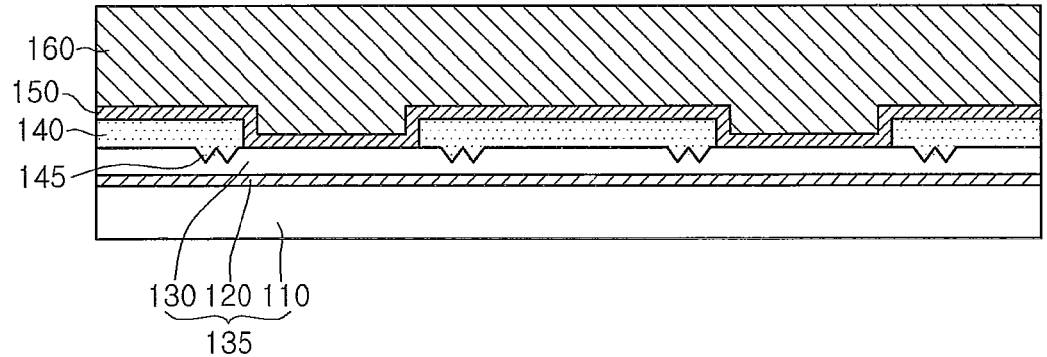

Referring to FIGS. 9 and 10, after the conductive support member 160 is disposed on a base, the substrate 101 is removed. The substrate 101 may be removed using a physical method and/or a chemical method. According to the physical method called laser lift off (LLO), laser having a predetermined wavelength range is irradiated onto the substrate 101, so the substrate 101 is separated from the first conductive semiconductor layer 110. According to the chemical method, when another semiconductor layer (e.g., a buffer layer) is formed between the substrate 101 and the first conductive semiconductor layer 110, the buffer layer is removed using wet etch solution, so the substrate 101 is separated from the first conductive semiconductor layer 110.

After the substrate 101 is removed, the first conductive semiconductor layer 110 is subject to an etching process using inductively coupled plasma/reactive ion etching (ICP/RIE).

The channel layer 140 and the protrusions 145 thereof can prevent delaminating of the second conductive semiconductor layer 130.

Figure 11:
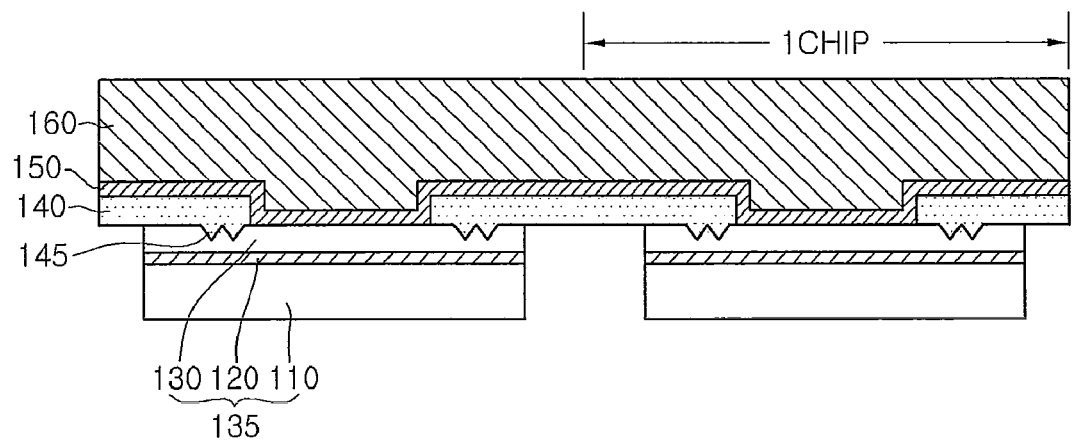
Figure 12:
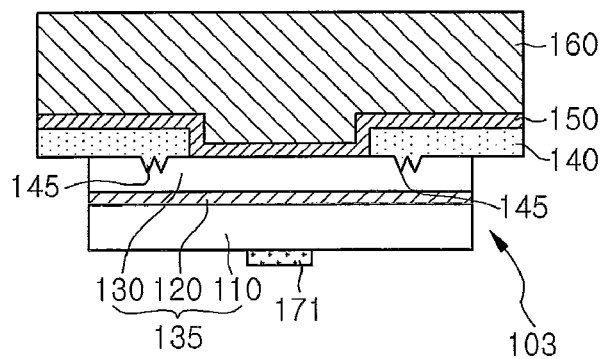

Referring to FIGS. 11 and 12, the light emitting structure 135 is partially removed by performing isolation etching relative to a boundary area (i.e. a channel area) between chips. The isolation etching is performed in such a manner that the channel layer 140 is exposed through the chip boundary area (i.e. the channel area). However, the embodiment is not limited thereto. In such a case, the channel layer 140 and the protrusions 145 can minimize lateral delaminating of the light emitting structure, which may occur during the isolation etching, that is, the KOH etching process.

During the isolation etching, the outer peripheral portion of the light emitting structure 135 is cut, so the light emitting structure 135 can be further spaced apart from the conductive support member 160.

The laser passes through the channel layer 140, so fragments caused by the conductive support member 160 or the electrode layer 150 can be minimized.

Then, the semiconductor light emitting device 100 is divided into a chip unit through a breaking process as shown in FIG. 12. Laser may be used to prepare the chip unit.

The electrode 171 is formed under the first conductive semiconductor layer 110 and may have a predetermined shape. Further, the electrode 171 can be prepared in the form of a predetermined pattern. The electrode 171 may be formed before or after the isolation etching process is performed, or after the chip separation process is performed. However, the embodiment is not limited thereto.

After the isolation etching process is performed, the roughness pattern can be formed on the bottom surface of the first conductive semiconductor layer 110 to improve external quantum efficiency.

Figure 13:
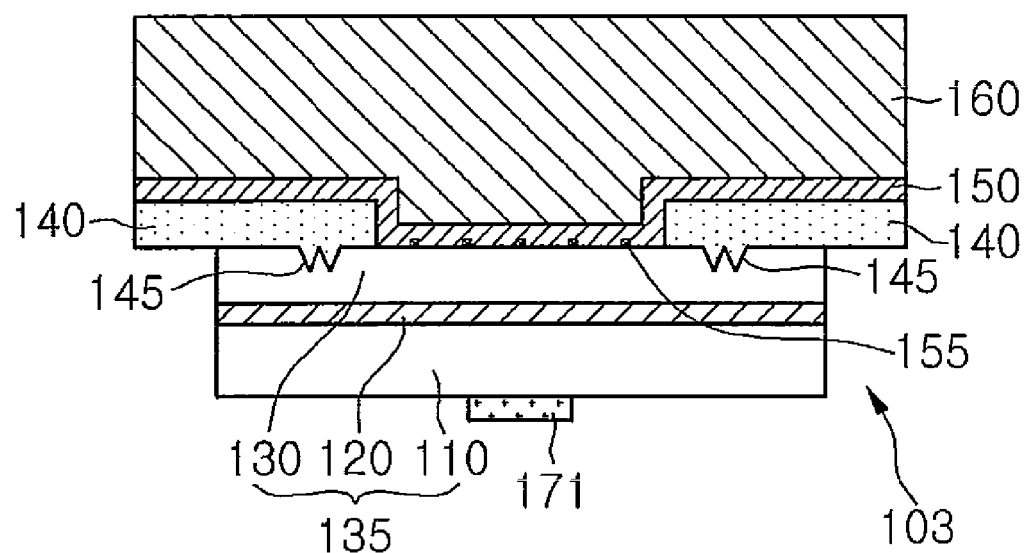
FIG. 13 is a side sectional view showing a semiconductor light emitting device according to a second embodiment.

FIG. 13 is a side sectional view showing a semiconductor light emitting device according to a second embodiment. The same reference numerals will be assigned to elements identical to those of the first embodiment, and details thereof will be omitted.

Referring to FIG. 13, the semiconductor light emitting device 100A includes the light emitting structure 135, the channel layer 140 having the protrusions 145, an ohmic contact layer 155, the electrode layer 150 and the conductive support member 160.

The ohmic contact layer 155 can be formed on an interface between the electrode layer 150 and the second conductive semiconductor layer 130 in the form of a plurality of patterns. The ohmic contact layer 155 may have a matrix pattern or a stripe pattern.

The ohmic contact layer 155 can enhance adhesive force relative to the second conductive semiconductor layer 130 together with the channel layer 140 and the protrusions 145.

The ohmic contact layer 155 may include at least one selected from the group consisting of ITO, IZO, IZTO, IAZO, IGZO, IGTO, AZO, ATO, GZO, IrOx, RuOx, RuOx/ITO, Ni/IrOx/Au and Ni/IrOx/Au/ITO.

The ohmic contact layer 155 can be prepared in the form of protrusions corresponding to grooves formed in the inner side of the upper surface of the second conductive semiconductor layer 130.

Further, the second conductive semiconductor layer 130 makes contact with the ohmic contact layer 155 and the electrode layer 150, so current distribution caused by ohmic resistance difference can be dispersed.

An embodiment provides a method for manufacturing a semiconductor light emitting device, the method comprising the steps of: forming a light emitting structure including a first conductive semiconductor layer, an active layer on the first conductive semiconductor layer and a second conductive semiconductor layer on the active layer; forming grooves along an upper peripheral portion of the second conductive semiconductor layer; forming a channel layer along an peripheral portion of an upper surface of the second conductive semiconductor layer; and forming an electrode layer on an inner side of the upper surface of the second conductive semiconductor layer.

According to the embodiment, interlayer adhesive force between the compound semiconductor layer and another layer is enhanced, so lateral delaminating can be minimized.

According to the embodiment, the conductive support member is spaced apart from the light emitting structure, so the chip reliability can be improved and the manufacturing process can be simplified.

According to the embodiment, the reliability of a vertical semiconductor light emitting device can be improved.

The embodiments can provide a semiconductor light emitting device such as an LED.

The embodiments can improve electrical reliability of the semiconductor light emitting device.

The embodiments can improve light efficiency of the semiconductor light emitting device.

According to the embodiments, a light source packaged with the semiconductor light emitting device can be employed in the fields of illumination, indication, display and the like.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
    a light emitting structure including a plurality of compound semiconductor layers;
    a conductive layer at a first region of a lower surface of the light emitting structure;
    a protective layer disposed under the light emitting structure and at an outer portion of the conductive layer; and
    a protrusion protruding inward the light emitting structure from the protective layer.

2. The semiconductor light emitting device of claim 1, wherein the light emitting structure includes a second conductive type semiconductor layer on the conductive layer, an active layer on the second conductive type semiconductor layer, and a first conductive type semiconductor layer connected to an electrode and disposed on the active layer, and
    wherein the protrusion is integrated with the protective layer, and is protruded at a depth less than a thickness of the second conductive type semiconductor layer such that the protrusion does not make contact with the active layer.

3. The semiconductor light emitting device of claim 1, wherein the protective layer includes one selected from the group consisting of $SiO_2$, $SiO_x$, $SiO_xN_y$, $Si_3N_4$, $Al_2O_3$, $TiO_2$, ITO, IZO, and AZO.

4. The semiconductor light emitting device of claim 1, wherein the protrusion protruding from the protective layer is formed in at least one line and has a loop shape at a peripheral portion of a lower surface of the light emitting structure.

5. The semiconductor light emitting device of claim 1, wherein the protrusion protruding from the protective layer are formed in a zigzag shape or an irregular pattern along a peripheral portion of a lower surface of the light emitting structure.

6. The semiconductor light emitting device of claim 1, wherein the conductive layer includes a reflective electrode material and is extended to a lower surface of the protective layer, comprising a conductive support member formed under the conductive layer.

7. The semiconductor light emitting device claim 1, wherein the protective layer is extended from a lower surface of the light emitting structure to an outer portion than a side surface of the light emitting structure.

8. The semiconductor light emitting device of claim 1, wherein the protrusion protruding the protective layer is integrated with the protective layer, and has a cross sectional shape in one of a semispherical shape, a half-oval shape, a polygonal shape, an inverse conical shape, and a column shape.

9. The semiconductor light emitting device of claim 2, wherein the protective layer includes one selected from the group consisting of $SiO_2$, $SiO_x$, $SiO_xN_y$, $Si_3N_4$, $Al_2O_3$, $TiO_2$, ITO, IZO, and AZO.

10. The semiconductor light emitting device of claim 2, wherein the protrusion protruding from the protective layer is formed in at least one line and has a loop shape at an peripheral portion of a lower surface of the light emitting structure.

11. The semiconductor light emitting device of claim 2, wherein the protrusion protruding from the protective layer is formed in a zigzag shape or an irregular pattern along a peripheral portion of a lower surface of the light emitting structure.

12. The semiconductor light emitting device of claim 2, wherein the conductive layer includes a reflective electrode material and is extended to a lower surface of the protective layer, comprising a conductive support member formed under the conductive layer.

13. The semiconductor light emitting device claim 2, wherein the protective layer is extended from a lower surface of the light emitting structure to an outer portion than a side surface of the light emitting structure.

14. The semiconductor light emitting device of claim 2, wherein the protrusion protruding the protective layer is integrated with the protective layer, and has a cross sectional shape in one of a semispherical shape, a half-oval shape, a polygonal shape, an inverse conical shape, and a column shape.

* * * * *